(12) United States Patent
Xu et al.

(10) Patent No.: US 9,524,991 B2
(45) Date of Patent: Dec. 20, 2016

(54) ARRAY SUBSTRATE AND MANUFACTURING METHOD THEREOF AND DISPLAY APPARATUS

(71) Applicant: BOE TECHNOLOGY GROUP CO., LTD., Beijing (CN)

(72) Inventors: Wenqing Xu, Beijing (CN); Hui Tian, Beijing (CN); Xiaowei Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/422,343

(22) PCT Filed: Jun. 30, 2014

(86) PCT No.: PCT/CN2014/081196
§ 371 (c)(1),
(2) Date: Feb. 18, 2015

(87) PCT Pub. No.: WO2015/074420
PCT Pub. Date: May 28, 2015

(65) Prior Publication Data
US 2016/0027813 A1  Jan. 28, 2016

(30) Foreign Application Priority Data
Nov. 25, 2013  (CN) .......................... 2013 1 0606817

(51) Int. Cl.
*H01L 27/12* (2006.01)
*H01L 27/32* (2006.01)
*H01L 29/786* (2006.01)

(52) U.S. Cl.
CPC ....... *H01L 27/1255* (2013.01); *H01L 27/1222* (2013.01); *H01L 27/1274* (2013.01); *H01L 27/3265* (2013.01); *H01L 29/78675* (2013.01)

(58) Field of Classification Search
CPC ............. H01L 29/786; H01L 29/78675; H01L 27/1255; H01L 27/3265; H01L 27/1222; H01L 27/1274
(Continued)

(56) References Cited

U.S. PATENT DOCUMENTS

2007/0285591 A1  12/2007  Moh et al.
2008/0084364 A1  4/2008  Bae et al.
(Continued)

FOREIGN PATENT DOCUMENTS

CN      1508614 A     6/2004
CN    102208406 A    10/2011
(Continued)

OTHER PUBLICATIONS

1st office action issued in Chinese application No. 201310606817.9 dated Sep. 21, 2015.
(Continued)

*Primary Examiner* — Tran Tran
(74) *Attorney, Agent, or Firm* — Nath, Goldberg & Meyer; Joshua B. Goldberg

(57) ABSTRACT

An array substrate and a manufacturing method thereof, and a display apparatus comprising the array substrate are provided. The array substrate comprises a base substrate, and a thin film transistor and a storing capacitor provided on the base substrate, the thin film transistor comprises a gate, a source, a drain and a gate insulation layer provided between the source and drain and the gate, the storing capacitor comprises a first plate, a second plate and a dielectric layer provided between the first plate and the second plate, wherein, both of the first plate and the second plate are formed of metal material, and the dielectric layer is formed of the same material as the gate insulation layer. In the array substrate of the present invention, the charging speed of the
(Continued)

storing capacitor can be improved and the display quality of the display apparatus comprising the array substrate is further improved.

19 Claims, 4 Drawing Sheets

(58) Field of Classification Search
USPC .......................................................... 257/52
See application file for complete search history.

(56) References Cited

U.S. PATENT DOCUMENTS

| | | | |
|---|---|---|---|
| 2009/0184315 A1* | 7/2009 | Lee | H01L 29/7869 257/43 |
| 2011/0156027 A1* | 6/2011 | Yamazaki | H01L 27/105 257/43 |
| 2013/0037812 A1 | 2/2013 | Park et al. | |
| 2015/0129864 A1* | 5/2015 | Hsu | H01L 29/78693 257/43 |

FOREIGN PATENT DOCUMENTS

| | | |
|---|---|---|
| CN | 102487043 A | 6/2012 |
| CN | 102931198 A | 2/2013 |
| CN | 103094305 A | 5/2013 |
| CN | 103681659 A | 3/2014 |

OTHER PUBLICATIONS

Form PCT/ISA/237 issued in International application No. PCT/CN2014/081196.

International Search Report for International Application No. PCT/CN2014/081196.

* cited by examiner

ARRAY SUBSTRATE AND MANUFACTURING METHOD THEREOF AND DISPLAY APPARATUS

This is a National Phase Application filed under 35 U.S.C. 371 as a national stage of PCT/CN2014/081196, filed Jun. 30, 2014, an application claiming the benefit of Chinese Application No. 201310606817.9, filed Nov. 25, 2013, the content of each of which is hereby incorporated by reference in its entirety.

FIELD OF THE INVENTION

The present invention relates to the field of display technology, and particularly relates to an array substrate and a manufacturing method thereof, and a display apparatus comprising the array substrate.

BACKGROUND OF THE INVENTION

With development of the display technology, people has increasing demand for display quality, and the demand for a panel display apparatus with high picture quality and high resolution becomes more and more common and gets more and more attention of display panel manufacturers.

A thin film transistor (TFT) is a main drive device of a flat display panel, and is directly related to the development direction of a panel display apparatus with high performance. There are various structures of thin film transistor, and there are various materials for manufacturing the corresponding structures of thin film transistor. Both of amorphous silicon and polycrystalline silicon are commonly used materials for preparing the corresponding structures of thin film transistor. However, amorphous silicon has many defects such as low mobility, low stability, etc., which cannot be avoided. By contrast, low temperature polycrystalline silicon (LTPS) has a higher mobility and stability, and the mobility of low temperature polycrystalline is up to dozens or even hundreds times of that of amorphous silicon. Thus, the technology of manufacturing thin film transistors by using material of low temperature polycrystalline silicon has been developed rapidly, and a new generation of liquid crystal display (LCD) or organic light emitting diode (OLED) display derived from LTPS becomes an important display technology. Especially, the OLED display apparatus, due to characteristics of ultra-thin, low power consumption, self-luminous, etc., are much favoured by users.

Although a low temperature polycrystalline silicon thin film transistor has above advantages, in an array substrate of LTPS TFT, in order to achieve continuous drive ability, a storing capacitor ($C_S$) is further needed to be provided. Especially, in a display panel with high resolution, in order to meet the need of driving, a storing capacitor allowed to be charged rapidly is generally needed to be provided for the low temperature polycrystalline silicon thin film transistor.

FIG. 1 shows a sectional view of a structure of an array substrate of LTPS TFT in the prior art. The array substrate comprises a buffer layer 2, an active layer 3, a first insulation layer 4', a gate 5, a second insulation layer 6', a source 71, a drain 72, a third insulation layer 8', a planarization layer 9 and a display electrode 10 which are successively arranged above a base substrate 1. Currently, this structure of array substrate is manufactured by performing eight patterning processes using eight masks. The eight patterning processes include: by using a mask for active layer (a-Si Mask), forming a pattern including the active layer 3 by a first patterning process; by using a mask for storing capacitor (Cs Mask), doping p-Si in a part of the first insulation layer 4' by a second patterning process to form a pattern including a first plate 11 of the storing capacitor Cs, wherein, the first plate of the storing capacitor Cs is formed by doping through a first ion injection method, but there may be a defect that the storing capacitor discharges slowly because the first plate thereof is formed through the first ion injection method; by using a mask for gate (Gate Mask), forming a pattern including the gate 5 and a second plate 12 of the storing capacitor Cs by a third patterning process, wherein, the second plate of the storing capacitor Cs is formed of gate metal; by using a mask for contact hole (Contact Mask), forming a pattern including contact holes for connecting the source 71 and the drain 72 with the active layer 3 in the second insulation layer 6' by a fourth patterning process; by using a mask for source and drain (S/D Mask), forming a pattern including the source 71 and the drain 72 by a fifth patterning process; by using a mask for via hole (VIA Mask), forming a pattern including a bridging via hole between the display electrode 10 and the drain 72 in the third insulation layer 8' by a sixth patterning process; by using a mask for planarization layer (PLN Mask), forming a pattern including a bridging via hole between the display electrode 10 and the drain 72 in the planarization layer 9 by a seventh patterning process and flatting the array substrate, so as to deposit an electrode layer on the flatted array substrate; by using a mask for pixel electrode (ITO Mask), forming a pattern of display electrode 10 by an eighth patterning process.

In view of above, in the prior art, the processes of manufacturing the array substrate comprising LTPS TFT and Cs are complex and include many procedures, resulting in a high produce cost. Meanwhile, because one plate of the storing capacitor is formed by doping, the charging speed of the storing capacitor is affected, resulting that the competitive advantage of LTPS TFT array substrate is reduced.

SUMMARY OF THE INVENTION

In view of the above defects existing in the prior art, the present invention provides an array substrate and a manufacturing method thereof, and a display apparatus comprising the array substrate, wherein, the processes of manufacturing the array substrate are simplified, and the charging speed of the storing capacitor is relatively rapid.

One technical solution of the present invention is an array substrate which comprises a base substrate, and a thin film transistor and a storing capacitor provided on the base substrate, the thin film transistor comprises a gate, a source, a drain and a gate insulation layer provided between the source and drain and the gate, the storing capacitor comprises a first plate, a second plate and a dielectric layer provided between the first plate and the second plate, wherein, both of the first plate and the second plate are formed of metal material, and the dielectric layer is formed of the same material as the gate insulation layer.

Preferably, the first plate is provided in the same layer as the source and the drain on the base substrate.

Preferably, the array substrate further comprises a buffer layer provided above the source and the drain, the buffer layer partially covers the source and is provided with a source via hole, and the buffer layer also partially covers the drain and is provided with a drain via hole.

Preferably, the array substrate further comprises an active layer provided above the buffer layer, and the active layer is connected to the source through the source via hole and connected to the drain through the drain via hole.

Preferably, the array substrate further comprises the gate insulation layer provided above the active layer, and the gate insulation layer extends to above the first plate to form the dielectric layer, the dielectric layer completely covers the first plate.

Preferably, the gate is formed of the same material as the second plate, the gate is provided above the gate insulation layer, the second plate is provided above the dielectric layer so as to correspond to the first plate.

Preferably, all of the source, the drain, the gate, the first plate and the second plate are formed of at least one of molybdenum, alloy of molybdenum and niobium, aluminum, alloy of aluminum and neodymium, titanium and copper, the active layer is formed of low temperature polycrystalline silicon.

Preferably, the buffer layer is of a single layer structure or a laminated structure of a plurality of sublayers, the buffer layer is formed of silicon oxide or silicon nitride.

Preferably, an interlayer insulation layer and a display electrode are further provided above the gate and the second plate, a via hole is provided in a part of the interlayer insulation layer corresponding to the drain, and the display electrode is electrically connected with the drain through the via hole.

Preferably, the interlayer insulation layer includes a passivation layer and an organic layer, the passivation layer is of a single layer structure or a laminated structure of a plurality of sublayers, and is formed of silicon oxide, silicon nitride, hafnium oxide or aluminum oxide, the organic layer is formed of organic resin, the organic resin includes acrylic film forming resin, phenolic film forming resin, vinyl polymer film forming resin or polyurethane film forming resin, the display electrode is a metal anode, the metal anode is formed of inorganic metal oxide, organic conductive polymer or metal with conductive performance and high work function value, the inorganic metal oxide includes indium tin oxide or zinc oxide, the organic conductive polymer includes PEDOT:SS and PANI, the metal includes gold, copper, argentum or platinum.

Preferably, the interlayer insulation layer includes a passivation layer, the passivation layer is of a single layer structure or a laminated structure of a plurality of sublayers, and is formed of silicon oxide, silicon nitride, hafnium oxide or aluminum oxide, the display electrode is a pixel electrode, the pixel electrode is formed of at least one of indium gallium zinc oxide, indium oxide, zinc oxide, indium zinc oxide, indium tin oxide, indium gallium tin oxide, and indium tin zinc oxide.

Another technical solution of the present invention is a display apparatus comprising the above array substrate.

Another technical solution of the present invention is a manufacturing method of an array substrate, the array substrate comprises a base substrate, and a thin film transistor and a storing capacitor provided on the base substrate, the thin film transistor comprises a source, a drain, a gate and a gate insulation layer provided between the source and drain and the gate, the storing capacitor comprises a first plate, a second plate and a dielectric layer provided between the first plate and the second plate, wherein, the manufacturing method comprises steps of: forming the first plate and the source and drain by a single patterning process; forming the dielectric layer and the gate insulation layer by a single patterning process; and forming the second plate and the gate by a single patterning process.

Preferably, the step of forming the first plate and the source and drain by a single patterning process comprises a step of: S1, forming a source and drain metal electrode film and a buffer film on the base substrate, forming a pattern including the source, the drain and the first plate by a single patterning process, and forming a pattern including the buffer layer above the source and the drain.

Preferably, the manufacturing method further comprises a step of: S2, forming an amorphous silicon film on the base substrate formed with the source, the drain and the first plate thereon, performing crystallization on the amorphous silicon film so as to form a polycrystalline silicon film, doping the polycrystalline silicon film and performing a single patterning process to form a pattern including the active layer.

Preferably, the step of forming the dielectric layer and the gate insulation layer by a single patterning process comprises a step of: S3, on the base substrate subjected to the step of S2, forming the gate insulation layer and a gate metal electrode film, the gate insulation layer further extends to completely cover area of the first plate so as to form the dielectric layer of the storing capacitor.

Preferably, the step of forming the second plate and the gate by a single patterning process comprises a step of: forming a pattern including the gate and the second plate by a single patterning process, the second plate is provided so as to correspond to the first plate.

Preferably, the manufacturing method further comprises a step of: by using an ion injection method, doping parts of the active layer corresponding to the source and the drain to enhance ohmic contact between the active layer and the source and drain.

Preferably, the manufacturing method further comprises a step of: forming a pattern including an interlayer insulation layer and a display electrode above the gate and the second plate, a via hole is formed in a part of the interlayer insulation layer corresponding to the drain, the drain is electrically connected with the display electrode through the via hole.

Preferably, the step of forming a pattern including the interlayer insulation layer and the display electrode comprises steps of: S4, on the base substrate subjected to the step of S3, forming a passivation film, forming a pattern including the passivation layer by a single patterning process, and a passivation layer via hole is formed in a part of the passivation layer corresponding to the drain; S5, on the base substrate subjected to the step of S4, forming an organic film, forming a pattern including the organic layer by a single patterning process, and an organic layer via hole is formed in a part of the organic layer corresponding to the drain; S6, on the base substrate subjected to the step of S5, forming a conductive metal film, forming a pattern including a metal anode by a single patterning process, the metal anode is electrically connected with the drain through the organic layer via hole and the passivation layer via hole.

Alternatively, the step of forming a pattern including the interlayer insulation layer and the display electrode comprises steps of: S4, on the base substrate subjected to the step of S3, forming a passivation film, forming a pattern including the passivation layer by a single patterning process, and a passivation layer via hole is formed in a part of the passivation layer corresponding to the drain; S5, on the base substrate subjected to the step of S4, forming a transparent conductive metal film, forming a pattern including a pixel electrode by a single patterning process, and the pixel electrode is electrically connected with the drain through the passivation layer via hole.

The present invention has following advantages: compared to the LTPS TFT array substrate in the prior art, in the LTPS TFT array substrate of the present invention, since the plates of the storing capacitor are formed of metal material, the surface resistances of the plates are smaller, the charging speed of the storing capacitor Cs in the array substrate can be increased, and display quality of the display apparatus comprising the array substrate is further improved, resulting in a guarantee for manufacturing a display apparatus with high resolution; in addition, two patterning processes and one ion injection process are reduced in the manufacturing method of the array substrate, the manufacturing procedure of the array substrate is simplified.

BRIEF DESCRIPTION OF THE DRAWINGS

FIG. 3A is a sectional view illustrating forming a source and drain metal electrode film and a buffer film.

FIG. 3B is a sectional view illustrating forming a pattern including a source, a drain, a buffer layer and a first plate of a storing capacitor.

FIG. 3C is a sectional view illustrating forming an active film.

FIG. 3D is a sectional view illustrating forming a pattern including the active layer.

FIG. 3E is a sectional view illustrating forming a gate insulation layer.

FIG. 3F is a sectional view illustrating forming a pattern of a gate metal electrode film.

FIG. 3G is a sectional view illustrating forming a pattern including a gate and a second plate of the storing capacitor.

FIG. 3H is a sectional view illustrating forming a passivation film.

FIG. 3I is a sectional view illustrating forming a pattern including a passivation layer and a passivation layer via hole.

FIG. 3J is a sectional view illustrating forming an organic film.

FIG. 3K is a sectional view illustrating forming a pattern including an organic layer and an organic layer via hole.

FIG. 3L is a sectional view illustrating forming a conductive metal film.

FIG. 3M is a sectional view illustrating forming a pattern of a display electrode.

Reference signs: 1, base substrate; 2, buffer layer; 20, buffer film; 3, active layer; 30, amorphous silicon film; 4, gate insulation layer; 4', first insulation layer; 5, gate; 50, gate metal electrode film; 6, passivation layer; 60, passivation film; 6', second insulation layer; 70, source and drain metal electrode film; 71, source; 72, drain; 8, organic layer; 80, organic film; 8', third insulation layer; 9, planarization layer; 10, display electrode; 100, conductive metal film; 11, first plate; 12, second plate; 13, dielectric layer.

DETAILED DESCRIPTION OF THE EMBODIMENTS

In order that those skilled in the art can better understand the technical solutions of the present invention, a further detailed description of an array substrate and a manufacturing method thereof and a display apparatus comprising the array substrate of the present invention will be given below in combination with the accompanying drawings and implementations.

The array substrate comprises a base substrate, and a thin film transistor and a storing capacitor provided on the base substrate, the thin film transistor comprises a gate, a source, a drain and a gate insulation layer provided between the source and drain and the gate, the storing capacitor comprises a first plate, a second plate and a dielectric layer provided between the first plate and the second plate, wherein, both of the first plate and the second plate are formed of metal material, and the dielectric layer is formed of the same material as the gate insulation layer.

The display apparatus comprises the above array substrate.

The manufacturing method of the array substrate comprises a step of forming a thin film transistor and a storing capacitor on a base substrate, the step of forming the thin film transistor comprises a step of forming a source, a drain, a gate and a step of forming a gate insulation layer between the source and drain and the gate, the step of forming the storing capacitor comprises a step of forming a first plate, a second plate and a dielectric layer between the first plate and the second plate, wherein, the first plate and the source and the drain are formed by a single patterning process, the second plate and the gate are formed by a single patterning process, the dielectric layer and the gate insulation layer are formed by a single patterning process.

First Embodiment

The present embodiment provides an array substrate suitable for OLED display apparatus.

Figure 1:
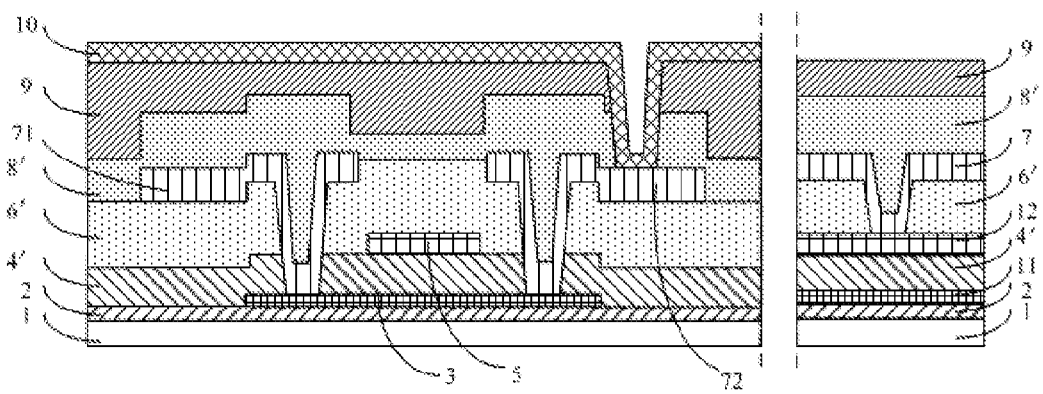
FIG. 1 is a sectional view of an array substrate in the prior art.
Figure 2:
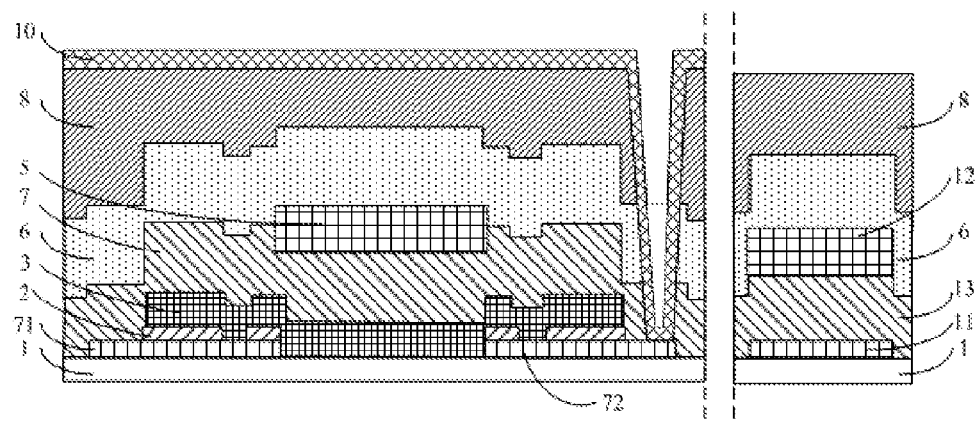
FIG. 2 is a sectional view of an array substrate in accordance with a first embodiment of the present invention.

As shown in FIG. 2, the array substrate comprises a base substrate 1, and a thin film transistor (TFT) and a storing capacitor Cs provided on the base substrate 1, the thin film transistor comprises a gate 5, a source 71, a drain 72 and a gate insulation layer 4 provided between the source 71 and drain 72 and the gate 5, the storing capacitor Cs comprises a first plate 11, a second plate 12 and a dielectric layer 13 provided between the first plate 11 and the second plate 12, wherein, both of the first plate 11 and the second plate 12 are formed of metal material, and the dielectric layer 13 is formed of the same material as the gate insulation layer 4.

The source 71 and the drain 72 are provided on the base substrate 1, a buffer layer 2 is provided above the source 71 and the drain 72, the buffer layer 2 partially covers the source 71 and is provided with a source via hole (via holes in structures of the present invention are not specifically marked in figures), and the buffer layer 2 also partially covers the drain 72 and is provided with a drain via hole. An active layer 3 is provided above the buffer layer 2, and the active layer 3 is connected to the source 71 through the source via hole and connected to the drain 72 through the drain via hole. The gate insulation layer 4 is provided above the active layer 3, the gate 5 is provided above the gate insulation layer 4, the first plate 11 is provided in the same layer on the base substrate 1 as the source 71 and the drain 72, the gate insulation layer 4 extends to above the first plate 11 to form the dielectric layer 13, the dielectric layer 13 completely covers the first plate 11. The second plate 12 is provided above a part of the dielectric layer 13 corresponding to the first plate 11.

In the present embodiment, the source 71, the drain 72, and the first plate 11 are formed of at least one of molybdenum, alloy of molybdenum and niobium, aluminum, alloy of aluminum and neodymium, titanium and copper.

The buffer layer 2 is of a single layer structure or a laminated structure of a plurality of sublayers, the buffer layer 2 is formed of silicon oxide or silicon nitride. Compared to the prior art, the buffer layer 2 is provided above the source 71 and the drain 72 so that the gate insulation layer 4 of the thin film transistor and the dielectric layer 13 of the storing capacitor Cs may be formed by a single patterning process subsequently without using a doping method. The structure that the buffer layer 2 is provided above the source 71 and the drain 72 not only facilitates to forming the source 71, the drain 72 and the buffer layer 2 by a single patterning process, but also enables to forming the storing capacitor Cs by using the source and drain metal electrode film, the gate insulation layer and the gate metal electrode film, resulting that the step of forming plates of the storing capacitor by doping in the prior art is avoided, and the charging and discharging performance of the storing capacitor is improved.

Meanwhile, the gate 5 and the second plate 12 are formed of at least one of molybdenum, alloy of molybdenum and niobium, aluminum, alloy of aluminum and neodymium, titanium and copper.

In order to implement control on image display using the thin film transistor TFT, an interlayer insulation layer and a display electrode 10 are further provided above the gate 5 and the second plate 12, a via hole is provided in an area of the interlayer insulation layer corresponding to the drain, and the display electrode 10 is electrically connected with the drain 72 through the via hole. It can be seen from FIG. 2 that, the interlayer insulation layer includes a passivation layer 6 and an organic layer (planarization layer) 8, the passivation layer 6 is of a single layer structure or a laminated structure of a plurality of sublayers, and is formed of silicon oxide, silicon nitride, hafnium oxide or aluminum oxide, the organic layer 8 is formed of organic resin, the organic resin includes acrylic film forming resin, phenolic film forming resin, vinyl polymer film forming resin or polyurethane film forming resin. In the present embodiment, the display electrode 10 is a metal anode of OLED device, the metal anode is formed of inorganic metal oxide, organic conductive polymer or metal with conductive performance and high work function value, the inorganic metal oxide includes indium tin oxide or zinc oxide, the organic conductive polymer includes PEDOT:SS and PANI, the metal includes gold, copper, argentum or platinum.

Correspondingly, the manufacturing method of the array substrate in the present embodiment comprises a step of forming the thin film transistor (TFT) and the storing capacitor Cs on the base substrate 1, the step of forming the thin film transistor comprises a step of forming the source 71, the drain 72, the gate 5 and a step of forming the gate insulation layer 4 between the source 71 and drain 72 and the gate 5, the step of forming the storing capacitor Cs comprises a step of forming the first plate 11 and the second plate 12 and forming the dielectric layer 13 between the first plate 11 and the second plate 12, wherein, the first plate 11 and the source 71 and drain 72 are formed by a single patterning process, the second plate 12 and the gate 5 are formed by a single patterning process, the dielectric layer 13 and the gate insulation layer 4 are formed by a single patterning process.

In the present invention, a patterning process may only include a photolithographic process, or include the photolithographic process and an etching step, may also include other processes such as printing, injecting, etc., for forming a predefined pattern. The photolithographic process refers to a process for forming a pattern by using photoresist, mask plate, exposure machine, etc., and includes process procedures such as film forming, exposing, developing and so on. Corresponding patterning processes may be selected in accordance with structures to be formed in the present invention.

Specifically, the manufacturing method of the array substrate comprises following steps of S1 to S6.

S1, forming a source and drain metal electrode film 70 and a buffer film 20 on the base substrate 1, forming a pattern including the source 71, the drain 72 and the first plate 11 by a single patterning process, and forming a pattern including the buffer layer 2 above the source 71 and the drain 72.

Figure 3A:
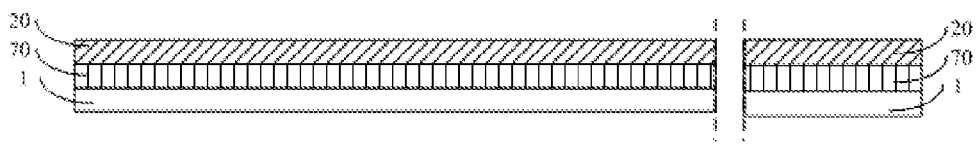
FIGS. 3A to 3M are sectional views of the array substrate of FIG. 2 in steps of manufacturing procedure.

In this step, the base substrate 1 is made of transparent material such as glass, and is subjected to pre-cleaning. Specifically, the source and drain metal electrode film 70 may be formed on the base substrate 1 by sputtering method, thermal evaporation method, plasma enhanced chemical vapor deposition (PECVD) method, low pressure chemical vapor deposition (LPCVD) method, atmospheric pressure chemical vapor deposition (APCVD) method or electron cyclotron resonance chemical vapor deposition (ECR-CVD) method, then the buffer film 20 is formed by plasma enhanced chemical vapor deposition method, low pressure chemical vapor deposition method, atmospheric pressure chemical vapor deposition method, electron cyclotron resonance chemical vapor deposition method or sputtering method, as shown in FIG. 3A.

Figure 3B:
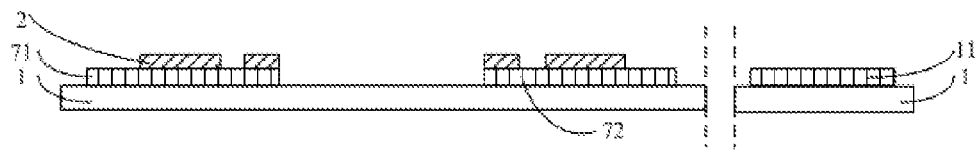

Then, by using a half tone mask (HTM) or a gray tone mask (GTM), a pattern including the source 71, the drain 72 and the first plate 11 is simultaneously formed by a single patterning process (film forming, exposing, developing, wet etching or dry etching), and a pattern including the buffer layer 2 is formed above the source 71 and the drain 72, as shown in FIG. 3B. The source 71, the drain 72 and the first plate 11 are formed of metal such as molybdenum, aluminum, titanium and copper or alloy such as alloy of molybdenum and niobium, alloy of aluminum and neodymium (collectively referred to as conductive material).

The buffer layer 2 may be made of material with similar lattice structure to that of Si, so as to facilitate to form an a-Si thin film (i.e., an amorphous silicon film 30 in the next step) above the buffer layer 2, thus, during the subsequent procedure of forming the gate insulation layer 4 of the thin film transistor, only the part of the a-Si thin film not overlapping with the plates of the storing capacitor needs to be etched off to form the dielectric layer 13 of the storing capacitor Cs, it is not necessary to form the plates of the storing capacitor Cs by doping method.

In the present embodiment, by using the half tone mask or the gray tone mask, the source 71, the drain 72 and the buffer layer 2 are prepared by a single patterning process, the number of exposures using mask plate is reduced.

S2, on the base substrate subjected to the step of S1, forming an amorphous silicon film 30, performing crystallization on the amorphous silicon film 30 so as to form a polycrystalline silicon film, doping the polycrystalline silicon film and performing a single patterning process to form a pattern including the active layer 3.

Figure 3C:
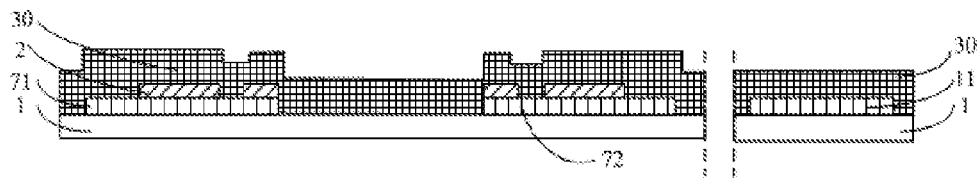

In this step, first, the amorphous silicon (a-Si) film 30 is formed above the buffer layer 2 by a deposition method, as shown in FIG. 3C. The deposition method includes plasma enhanced chemical vapor deposition method, or low pressure chemical vapor deposition method.

Then, crystallization is performed on the amorphous silicon film 30. For example, the amorphous silicon film 30 is converted into a polycrystalline silicon (p-Si) film by using excimer laser crystallization method, metal induction crystallization method or solid phase crystallization method, and then, the polycrystalline silicon (p-Si) film is doped (p-type or n-type) to define conduction type of channel of the thin film transistor. The excimer laser crystallization method and the metal induction crystallization method are two methods of low temperature polycrystalline silicon, and are generally used methods for converting amorphous silicon into polycrystalline silicon. However, the present invention is not limited to convert amorphous silicon into polycrystalline silicon by using a method of low temperature polycrystalline silicon, as long as the active layer 30 is converted into the required polycrystalline silicon film.

Figure 3D:
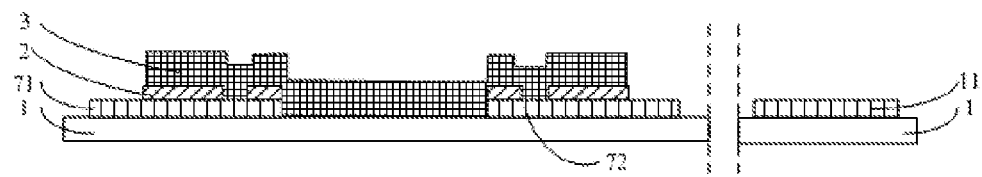

Finally, by using a second patterning process, a pattern including the active layer 3 is formed, as shown in FIG. 3D. That is, a layer of photoresist is formed on the polycrystalline silicon film 30, then the photoresist is exposed and developed, and the polycrystalline silicon film 30 is dry etched to form a pattern including the active layer 3.

S3, on the base substrate subjected to the step of S2, forming the gate insulation layer 4 and a gate metal electrode film 50, the gate insulation layer 4 further extends to completely cover area of the first plate 11 so as to form the dielectric layer 13 of the storing capacitor Cs, forming a pattern including the gate 5 and the second plate 12 by a single patterning process, the second plate 12 is provided correspondingly to the first plate 11.

Figure 3E:
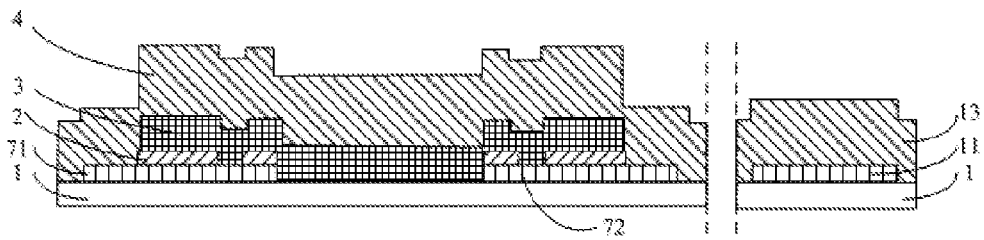
Figure 3F:
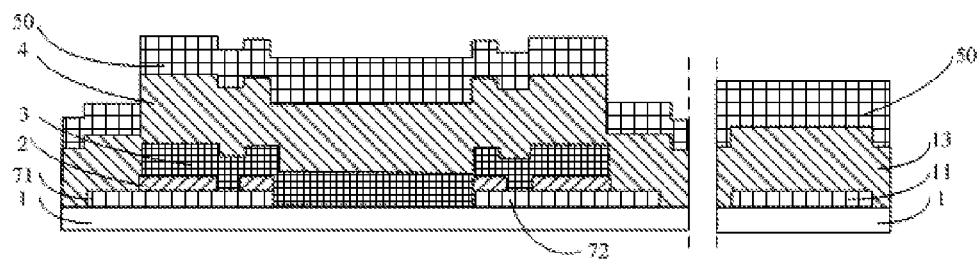
Figure 3G:
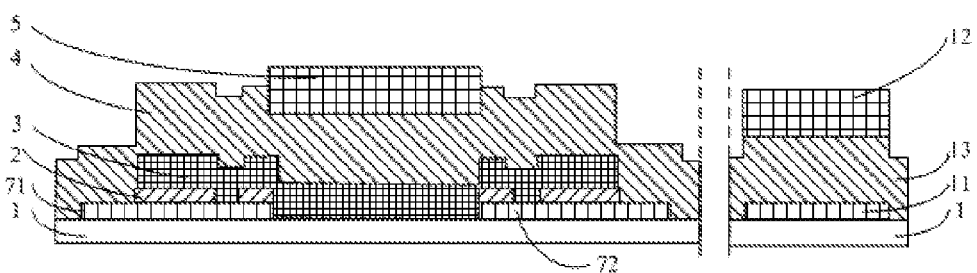

In this step, first, the gate insulation layer 4 and the dielectric layer 13 are formed above the active layer 3 and the first plate 11 by plasma enhanced chemical vapor deposition method, low pressure chemical vapor deposition method, atmospheric pressure chemical vapor deposition method, electron cyclotron resonance chemical vapor deposition method or sputtering method, as shown in FIG. 3E. Then, the gate metal electrode film 50 is formed by sputtering method, thermal evaporation method, plasma enhanced chemical vapor deposition method, low pressure chemical vapor deposition method, atmospheric pressure chemical vapor deposition method or electron cyclotron resonance chemical vapor deposition method, as shown in FIG. 3F. Finally, the pattern including the gate 5 and the second plate 12 is formed by performing a third patterning process, the second plate 12 is provided correspondingly to the first plate 11, as shown in FIG. 3G.

This step further comprises a step of: doping a part of the active layer 3 corresponding to the source 71 and the drain 72 to enhance ohmic contact between the active layer 3 and the source 71 and drain 72, so as to ensure a well ohmic contact between the active layer 3 and the source 71 and drain 72 without doping a part of the active layer 3 corresponding to the gate 5, this is because that doping is performed after forming the pattern of the gate 5 by etching, since blocking effect of the gate 5, the part of the active layer 3 corresponding to the gate 5 cannot be doped, and since the part of the active layer 3 corresponding to the gate 5 will function as a channel, it is not need to be doped. The ion injection method includes ion injection mode with quality analyzer, ion injection mode without quality analyzer, plasma injection mode or solid state diffusion injection mode. In the present embodiment, the active layer 3 with good semiconductor property is finally formed by performing steps of crystallization, doping, ion injection, etc. on material of low temperature polycrystalline silicon.

So far, the thin film transistor and the storing capacitor Cs are completely prepared. In order to perform insulation protection on the thin film transistor and the storing capacitor Cs and facilitate to perform control on image display using the thin film transistor, the manufacturing method further comprises a step of: forming a pattern including an interlayer insulation layer and a display electrode 10 above the gate 5 and the second plate 12, and forming a via hole in a part of the interlayer insulation layer corresponding to the drain 72, wherein the drain 72 is electrically connected with the display electrode 10 through the via hole. In the present embodiment, the interlayer insulation layer includes a passivation layer 6 and an organic layer 8, and the display electrode 10 is a metal anode.

Specifically, the step of forming a pattern including the interlayer insulation layer and the display electrode 10 comprises steps of S4 to S6.

S4, on the base substrate subjected to the step of S3, forming a passivation film 60, forming a pattern including the passivation layer 6 by a single patterning process, and a passivation layer via hole is formed in a part of the passivation layer 6 corresponding to the drain 72.

Figure 3H:
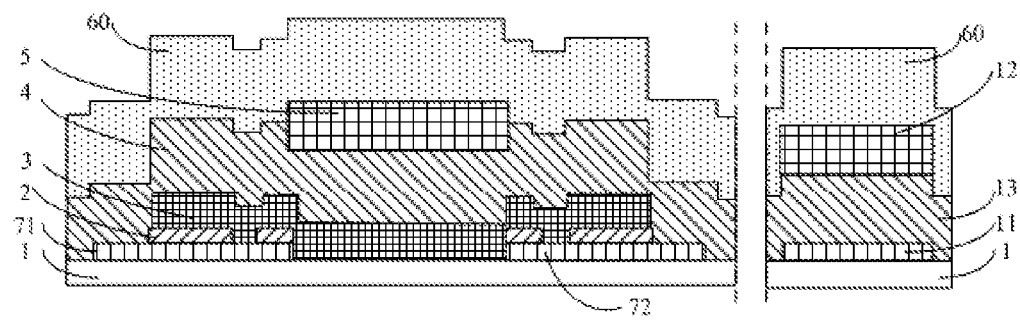
Figure 3I:
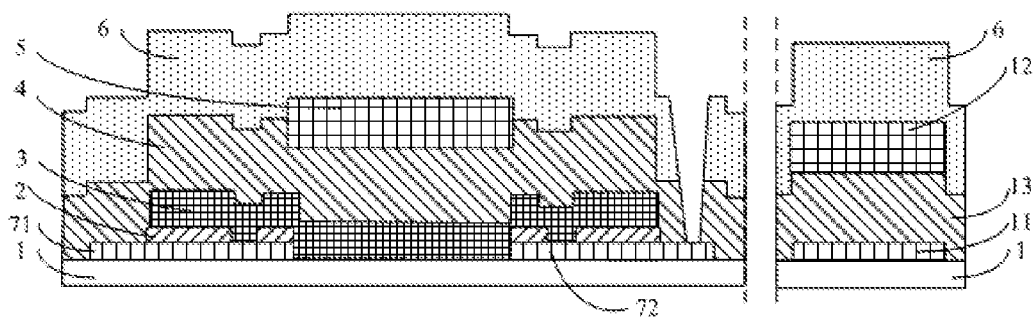

In this step, as shown in FIG. 3H, the passivation film 60 is deposited above the thin film transistor and the storing capacitor Cs. By the same manner as depositing the gate insulation layer 4, the passivation film 60 may be deposited by plasma enhanced chemical vapor deposition method, low pressure chemical vapor deposition method, atmospheric pressure chemical vapor deposition method or electron cyclotron resonance chemical vapor deposition method, and the passivation film 60 may be formed by a single layer of silicon oxide, or may be formed by a laminated structure of a plurality of sublayers formed of silicon oxide and/or silicon nitride. Then, a pattern including the passivation layer 6 is formed by a fourth patterning process, and a passivation via hole is formed in a part of the passivation layer 6 corresponding to the drain 72, as shown in FIG. 3I.

S5, on the base substrate subjected to the step of S4, forming an organic film 80, forming a pattern including the organic layer 8 by a single patterning process, and an organic layer via hole is formed in a part of the organic layer 8 corresponding to the drain 72.

Figure 3J:
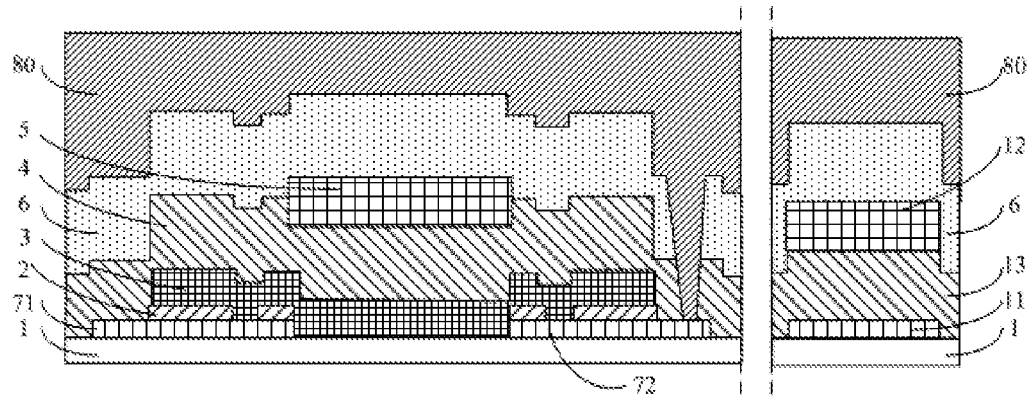
Figure 3K:
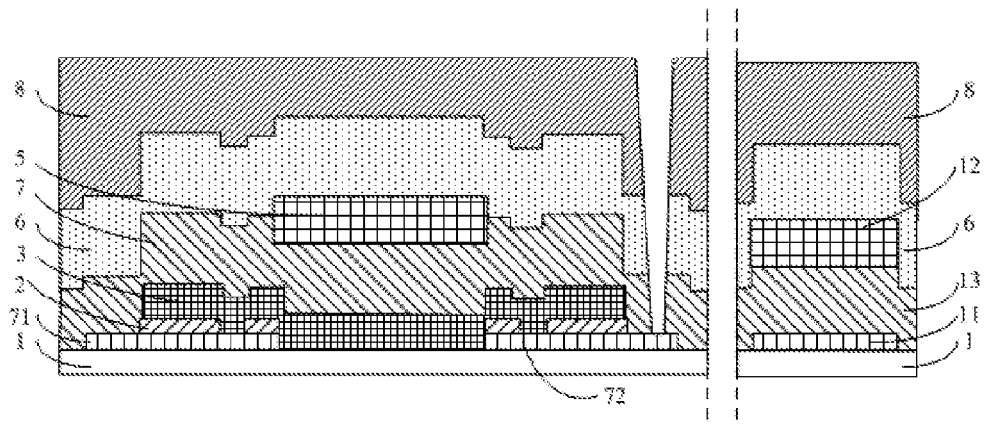

In this step, the organic film 80 is formed above the passivation layer 6 by coating (including spin coating), as shown in FIG. 3J. The organic film 80 is formed of organic resin, and the organic resin includes acrylic film forming resin, phenolic film forming resin, vinyl polymer film forming resin or polyurethane film forming resin. Then, a pattern including the organic layer 8 is formed by a fifth patterning process, and an organic via hole is formed in a part of the organic layer 8 corresponding to the drain 72, as shown in FIG. 3K.

S6, on the base substrate subjected to the step of S5, forming a conductive metal film 100, forming a pattern including a metal anode by a single patterning process, the metal anode is electrically connected with the drain 72 through the organic layer via hole and the passivation layer via hole.

In this step, the conductive metal film 100 is deposited above the organic layer 8 by sputtering method, thermal evaporation method, plasma enhanced chemical vapor deposition method, low pressure chemical vapor deposition method, atmospheric pressure chemical vapor deposition method or electron cyclotron resonance chemical vapor deposition method. The conductive metal film 100 has a high reflectance, meets requirement for a certain work function, and generally has a structure of two or three layers of film, for example, has a structure of indium tin oxide (ITO)/argentum (Ag)/indium tin oxide (ITO) or argentum (Ag)/indium tin oxide (ITO), or, indium tin oxide in the above structure is replaced by indium zinc oxide (IZO), indium gallium zinc oxide (IGZO) or indium gallium stannum oxide (InGaSnO). Of course, the conductive metal film 100 may also be formed of inorganic metal oxide, organic conductive polymer or metal with conductive performance and high work function value, the inorganic metal oxide includes indium tin oxide or zinc oxide, the organic conductive polymer includes PEDOT:SS and PANI, the metal includes gold, copper, argentum or platinum.

Figure 3L:
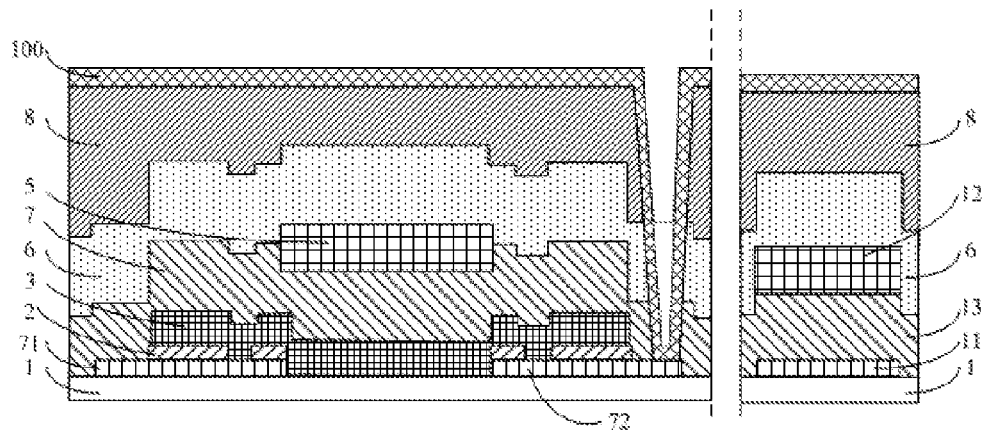
Figure 3M:
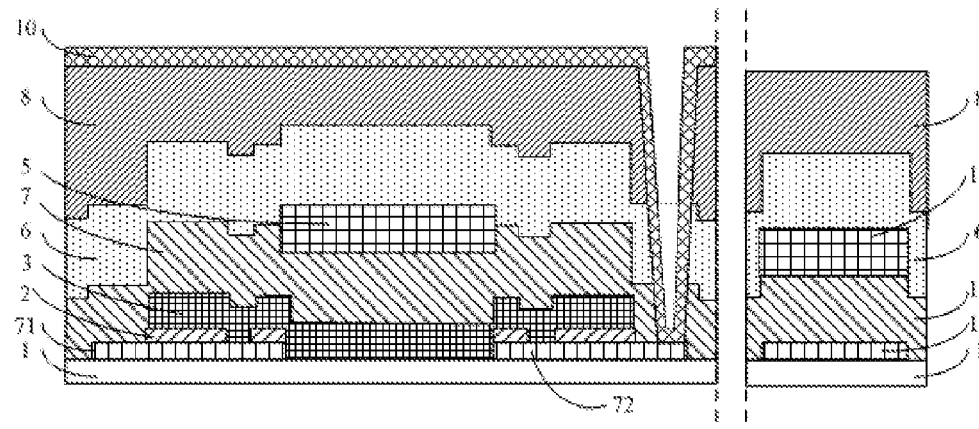

Then, a pattern including the display electrode 10 is formed by a sixth patterning process, and the display electrode 10 is electrically connected with the drain 72 through the organic layer via hole and the passivation layer via hole, as shown in FIG. 3L.

On a basis of the above structure of the array substrate, a pixel define layer (PDL) is further prepared, then an emitting layer (EL) is vapored or coated, finally, a metal cathode layer is formed by sputtering or vaporing, and encapsulation is performed to form the array substrate with OLED device.

In the present embodiment, one of two plates of the storing capacitor Cs is formed of the same metal material as the source and drain of the thin film transistor, the other plate thereof is formed of the same metal material as the gate of the thin film transistor, and the dielectric layer between the two plates is formed of the same material as the gate insulation layer, resulting that, the step of forming the storing capacitor by a separate patterning process is avoided, and one ion injection process is also avoided, which simplifies the manufacturing process of the array substrate. Meanwhile, compared to the plates formed by doping in the prior art, the surface resistances of the plates formed of metal material are smaller. Thus, the charging speed of the storing capacitor in the array substrate of the present embodiment is faster, that is, in the array substrate of the present embodiment, the charging speed of the storing capacitor Cs may be improved, and the thin film transistor with stable driving capability may be obtained, the display quality of the display apparatus comprising the array substrate is further improved so that preparation of LTPS TFT-OLED display apparatus with high resolution is ensured.

Second Embodiment

The present embodiment provides an array substrate suitable for liquid crystal display apparatus of TN mode, VA mode or ADS mode.

In structure of the array substrate of the present embodiment, all of the structures below the interlayer insulation layer and the display electrode are the same as those of the first embodiment, and will not be repeated here.

In the array substrate of the present embodiment, the interlayer insulation layer includes a passivation layer, and the passivation layer is of a single layer structure or a laminated structure of a plurality of sublayers, and is formed of silicon oxide, silicon nitride, hafnium oxide or aluminum oxide, the display electrode is a pixel electrode, and the pixel electrode is formed of at least one of indium gallium zinc oxide, indium oxide, zinc oxide, indium zinc oxide, indium tin oxide, indium gallium tin oxide or indium tin zinc oxide.

The manufacturing method of the array substrate of the present embodiment comprises steps of S1 to S5.

S1, forming a source and drain metal electrode film and a buffer film on the base substrate, forming a pattern including the source, the drain and the first plate by a single patterning process, and forming a pattern including the buffer layer above the source and the drain.

S2, forming an amorphous silicon film on the base substrate subjected to the step of S1, performing crystallization on the amorphous silicon film so as to form a polycrystalline silicon film, doping the polycrystalline silicon film and performing a single patterning process to form a pattern including the active layer.

S3, on the base substrate subjected to the step of S2, forming the gate insulation layer and a gate metal electrode film, the gate insulation layer further extends to completely cover area of the first plate so as to form the dielectric layer of the storing capacitor, forming a pattern including the gate and the second plate by a single patterning process, the second plate is provided so as to correspond to the first plate.

S4, on the base substrate subjected to the step of S3, forming a passivation film, forming a pattern including the passivation layer by a single patterning process, and a passivation layer via hole is formed in a part of the passivation layer corresponding to the drain.

S5, on the base substrate subjected to the step of S4, forming a transparent conductive metal film, forming a pattern including a pixel electrode by a single patterning process, and the pixel electrode is electrically connected with the drain through the passivation layer via hole, wherein, the transparent conductive metal film is formed of at least one of transparent conductive materials such as indium gallium zinc oxide (IGZO), indium zinc oxide (IZO), indium tin oxide (ITO), or indium gallium stannum oxide (InGaSnO).

The array substrate of the present embodiment is suitable for liquid crystal display apparatus of twisted nematic (TN) mode or vertical alignment (VA) mode.

Further, an insulation layer and a common electrode are formed on the above array substrate, which is suitable for the array substrate in a liquid crystal display apparatus of advanced super dimension switch (ADS) mode. In the ADS mode, a multidimensional electric field is formed by the field generated by edges of slit electrodes in the same plane and the field generated between the layer of slit electrodes and a plate electrode layer, so that all of liquid crystal molecules in the liquid crystal cell among the slit electrodes and directly above the electrodes can rotate, resulting that work efficiency of liquid crystal is improved and transmission efficiency is increased. Thus, advanced super dimension switch technology can improve display picture quality of LCD product, and result in advantages of high resolution, high transmittance, low power consumption, wide view angle, high aperture, low chromatic aberration, no push mura, etc.

Third Embodiment

The present embodiment provides a display apparatus comprising the array substrate of the first or second embodiment.

The display apparatus may be a liquid crystal display apparatus or an electroluminescent display device, for example, may be any product or member with displaying function such as a liquid crystal panel, an electronic paper, an OLED panel, a mobile phone, a tablet computer, a TV, a monitor, a notebook computer, a digital photo frame, a navigator and so on.

The display apparatus of the present embodiment has good display quality.

The present invention provides a structure of LTPS TFT array substrate and a corresponding manufacturing method thereof, compared to the LTPS TFT array substrate in the prior art, in the LTPS TFT array substrate of the present invention, since the plates of the storing capacitor are formed of metal, the surface resistances of the plates are smaller, the charging speed of the storing capacitor Cs in the array substrate can be increased, and display quality of the display apparatus comprising the array substrate is further improved, resulting in a guarantee for manufacturing a display apparatus with high resolution, thus the array substrate of the present invention is especially suitable for TFT-OLED display apparatus; in addition, two patterning processes and one ion injection process are reduced in the manufacturing method of the array substrate, the manufacturing procedure of the array substrate is simplified.

It can be understood that, the foregoing implementations are merely exemplary implementations used for explaining the principle of the present invention, but the present invention is not limited thereto. Those of ordinary skill in the art may make various variations and improvements without departing from the spirit and essence of the present invention, and these variations and improvements also fall within the protection scope of the present invention.

The invention claimed is:

1. An array substrate, comprising:
a base substrate, and a thin film transistor and a storing capacitor provided on the base substrate, wherein the thin film transistor comprises a gate, a source, a drain and a gate insulation layer provided between the source and drain and the gate;
the storing capacitor comprises a first plate, a second plate and a dielectric layer provided between the first plate and the second plate, wherein, both of the first plate and the second plate are formed of metal material; and
the dielectric layer is formed of the same material as the gate insulation layer; and the array substrate further comprises:
a buffer layer provided above the source and the drain, the buffer layer partially covers the source and is provided with a source via hole, and the buffer layer also partially covers the drain and is provided with a drain via hole; and
an active layer provided above the buffer layer, and the active layer is connected to the source through the source via hole and connected to the drain through the drain via hole.

2. The array substrate of claim 1, wherein the first plate is provided in the same layer as the source and the drain on the base substrate.

3. The array substrate of claim 1, the array substrate further comprises the gate insulation layer provided above the active layer, and the gate insulation layer extends to above the first plate to form the dielectric layer, the dielectric layer completely covers the first plate.

4. The array substrate of claim 1, wherein the gate is formed of the same material as the second plate, the gate is provided above the gate insulation layer, the second plate is provided above the dielectric layer so as to correspond to the first plate.

5. The array substrate of claim 1, wherein all of the source, the drain, the gate, the first plate and the second plate are formed of at least one of molybdenum, alloy of molybdenum and niobium, aluminum, alloy of aluminum and neodymium, titanium and copper, the active layer is formed of low temperature polycrystalline silicon.

6. The array substrate of claim 1, wherein the buffer layer is of a single layer structure or a laminated structure of a plurality of sublayers, the buffer layer is formed of silicon oxide or silicon nitride.

7. The array substrate of claim 1, wherein an interlayer insulation layer and a display electrode are further provided above the gate and the second plate, a via hole is provided in a part of the interlayer insulation layer corresponding to the drain, and the display electrode is electrically connected with the drain through the via hole.

8. The array substrate of claim 7, wherein the interlayer insulation layer includes a passivation layer and an organic layer, the passivation layer is of a single layer structure or a laminated structure of a plurality of sublayers, and is formed of silicon oxide, silicon nitride, hafnium oxide or aluminum oxide, the organic layer is formed of organic resin, the organic resin includes acrylic film forming resin, phenolic film forming resin, vinyl polymer film forming resin or polyurethane film forming resin,
the display electrode is a metal anode, the metal anode is formed of inorganic metal oxide, organic conductive polymer or metal with conductive performance and high work function value, the inorganic metal oxide includes indium tin oxide or zinc oxide, the organic conductive polymer includes PEDOT:SS and PANI, the metal includes gold, copper, argentum or platinum.

9. The array substrate of claim 7, wherein the interlayer insulation layer includes a passivation layer, the passivation layer is of a single layer structure or a laminated structure of a plurality of sublayers, and is formed of silicon oxide, silicon nitride, hafnium oxide or aluminum oxide,
the display electrode is a pixel electrode, the pixel electrode is formed of at least one of indium gallium zinc oxide, indium oxide, zinc oxide, indium zinc oxide, indium tin oxide, indium gallium tin oxide, and indium tin zinc oxide.

10. A display apparatus comprising the array substrate of claim 1.

11. A manufacturing method of the array substrate according to claim 1, comprising steps of:
forming the first plate and the source and drain by a single patterning process;
forming the dielectric layer and the gate insulation layer by a single patterning process; and
forming the second plate and the gate by a single patterning process.

12. The manufacturing method of claim 11, wherein the step of forming the first plate and the source and drain by a single patterning process comprises a step of:
S1, forming a source and drain metal electrode film and a buffer film on the base substrate, forming a pattern including the source, the drain and the first plate by a single patterning process, and forming a pattern including the buffer layer above the source and the drain.

13. The manufacturing method of claim 11, further comprises a step of:
S2, forming an amorphous silicon film on the base substrate formed with the source, the drain and the first plate thereon, performing crystallization on the amorphous silicon film so as to form a polycrystalline silicon film, doping the polycrystalline silicon film and performing a single patterning process to form a pattern including the active layer.

14. The manufacturing method of claim 13, wherein the step of forming the dielectric layer and the gate insulation layer by a single patterning process comprises a step of:
S3, on the base substrate subjected to the step of S2, forming the gate insulation layer and a gate metal electrode film, the gate insulation layer further extends to completely cover the first plate so as to form the dielectric layer of the storing capacitor.

15. The manufacturing method of claim 14, wherein the step of forming the second plate and the gate by a single patterning process comprises a step of: forming a pattern including the gate and the second plate by a single patterning process, the second plate is provided so as to correspond to the first plate.

16. The manufacturing method of claim 13, further comprises a step of: by using an ion injection method, doping parts of the active layer corresponding to the source and the drain to enhance ohmic contact between the active layer and the source and drain.

17. The manufacturing method of claim 15, further comprises a step of: forming a pattern including an interlayer insulation layer and a display electrode above the gate and the second plate, a via hole is formed in a part of the interlayer insulation layer corresponding to the drain, the drain is electrically connected with the display electrode through the via hole.

18. The manufacturing method of claim 17, wherein the step of forming a pattern including the interlayer insulation layer and the display electrode comprises steps of:
    S4, on the base substrate subjected to the step of S3, forming a passivation film, forming a pattern including the passivation layer by a single patterning process, and a passivation layer via hole is formed in a part of the passivation layer corresponding to the drain;
    S5, on the base substrate subjected to the step of S4, forming an organic film, forming a pattern including the organic layer by a single patterning process, and an organic layer via hole is formed in a part of the organic layer corresponding to the drain;
    S6, on the base substrate subjected to the step of S5, forming a conductive metal film, forming a pattern including a metal anode by a single patterning process, the metal anode is electrically connected with the drain through the organic layer via hole and the passivation layer via hole.

19. The manufacturing method of claim 17, wherein the step of forming a pattern including the interlayer insulation layer and the display electrode comprises steps of:
    S4, on the base substrate subjected to the step of S3, forming a passivation film, forming a pattern including the passivation layer by a single patterning process, and a passivation layer via hole is formed in a part of the passivation layer corresponding to the drain;
    S5, on the base substrate subjected to the step of S4, forming a transparent conductive metal film, forming a pattern including a pixel electrode by a single patterning process, and the pixel electrode is electrically connected with the drain through the passivation layer via hole.

* * * * *